(12) United States Patent
Guery et al.

(10) Patent No.: US 12,471,812 B2
(45) Date of Patent: Nov. 18, 2025

(54) SUBCUTANEOUS BIOSENSOR

(71) Applicant: Analog Devices, Inc., Wilmington, MA (US)

(72) Inventors: Alain Valentin Guery, Boston, MA (US); J. Brian Harrington, Upton, MA (US); Phillip Nadeau, Cambridge, MA (US); Joyce Wu, Somerville, MA (US); Amrita Ray Chaudhury, Woburn, MA (US)

(73) Assignee: Analog Devices, Inc., Wilmington, MA (US)

( * ) Notice: Subject to any disclaimer, the term of this patent is extended or adjusted under 35 U.S.C. 154(b) by 718 days.

(21) Appl. No.: 17/384,937

(22) Filed: Jul. 26, 2021

(65) Prior Publication Data

US 2021/0353184 A1    Nov. 18, 2021

Related U.S. Application Data

(63) Continuation of application No. PCT/US2020/014692, filed on Jan. 23, 2020.
(Continued)

(51) Int. Cl.
*A61B 5/1459* (2006.01)
*A61B 5/00* (2006.01)
*A61B 5/145* (2006.01)

(52) U.S. Cl.
CPC .......... *A61B 5/1459* (2013.01); *A61B 5/0017* (2013.01); *A61B 5/002* (2013.01);
(Continued)

(58) Field of Classification Search
CPC ... A61B 5/1459; A61B 5/0017; A61B 5/0031; A61B 5/14546; A61B 2562/164
(Continued)

(56) References Cited

U.S. PATENT DOCUMENTS 5,165,407 A     11/1992  Wilson et al.
6,201,980 B1     3/2001  Darrow et al.
(Continued)

FOREIGN PATENT DOCUMENTS

WO        2018112008        6/2018

OTHER PUBLICATIONS

Wilson et al., *Progress Toward the Development of an Implantable Sensor for Glucose*, Clinical Chemistry, vol. 38, No. 9, 1992, 6 pages.
(Continued)

*Primary Examiner* — Alex M Valvis
*Assistant Examiner* — Chanel J Jhin
(74) *Attorney, Agent, or Firm* — ArentFox Schiff LLP

(57) ABSTRACT

One embodiment is a multi-analyte molecular sensing system designed for implantation in a body of a subject, the sensing system including an implant comprising a flexible substrate having a plurality of electronics systems disposed thereon; a sensor array comprising multiple sensors disposed on the flexible substrate; a sensor protection mechanism for providing selective protection and exposure of one or more of the sensors; a power system for providing power to the electronics systems; a data communication system for communicating with one or more external devices; and a biocompatible housing for protecting the implant.

17 Claims, 7 Drawing Sheets

Related U.S. Application Data

(60) Provisional application No. 62/800,221, filed on Feb. 1, 2019.

(52) U.S. Cl.
CPC .......... *A61B 5/0022* (2013.01); *A61B 5/0031* (2013.01); *A61B 5/14546* (2013.01); *A61B 2562/066* (2013.01); *A61B 2562/164* (2013.01)

(58) Field of Classification Search
USPC .......................................................... 600/342
See application file for complete search history.

(56) References Cited

U.S. PATENT DOCUMENTS

| | | | |
|---|---|---|---|
| 6,405,066 | B1 | 6/2002 | Essenpreis et al. |
| 6,551,838 | B2 | 4/2003 | Santini, Jr. et al. |
| 6,613,379 | B2 | 9/2003 | Ward et al. |
| 6,849,463 | B2 | 2/2005 | Santini, Jr. et al. |
| 7,410,616 | B2 | 8/2008 | Santini, Jr. et al. |
| 7,577,470 | B2 | 8/2009 | Shah et al. |
| 7,614,135 | B2 | 11/2009 | Santini, Jr. et al. |
| 7,648,677 | B2 | 1/2010 | Santini, Jr. et al. |
| 8,277,713 | B2 | 10/2012 | Petisce et al. |
| 8,280,476 | B2 | 10/2012 | Jina |
| 8,442,611 | B2 | 5/2013 | Santini, Jr. et al. |
| 8,574,615 | B2 | 11/2013 | Tenney et al. |
| 9,259,175 | B2 | 2/2016 | Stafford |
| 9,339,529 | B2 | 5/2016 | Anderson et al. |
| 9,532,738 | B2 | 1/2017 | Delbeke et al. |
| 9,775,551 | B2 | 10/2017 | Bernstein et al. |
| 2003/0049865 | A1* | 3/2003 | Santini, Jr. ............... A61B 5/00 382/128 |
| 2005/0096587 | A1 | 5/2005 | Santini, Jr. et al. |
| 2006/0004272 | A1* | 1/2006 | Shah ..................... A61B 5/412 600/365 |
| 2007/0129620 | A1 | 6/2007 | Krulevitch et al. |
| 2009/0018403 | A1* | 1/2009 | Black .................. A61B 5/0031 600/300 |
| 2009/0163895 | A1 | 6/2009 | Ausiello et al. |
| 2009/0292185 | A1 | 11/2009 | Funderburk et al. |
| 2010/0198034 | A1 | 8/2010 | Thomas et al. |
| 2010/0331647 | A1 | 12/2010 | Shah et al. |
| 2013/0217983 | A1 | 8/2013 | Rebec et al. |
| 2016/0051197 | A1* | 2/2016 | Umemoto ............ A61B 5/0215 600/300 |
| 2016/0235365 | A1 | 8/2016 | Liu et al. |
| 2017/0020661 | A1* | 1/2017 | Cheatham, III .......... A61F 2/16 |
| 2019/0083495 | A1 | 3/2019 | Doloff et al. |
| 2019/0091139 | A1 | 3/2019 | Ma et al. |
| 2019/0184067 | A1 | 6/2019 | Vegas et al. |

OTHER PUBLICATIONS

*Implantable Sensor Relays Real-Time Personal Health Data to a Cell Phone*, American Chemical Society, https://www.acs.org/content/acs/en/pressroom/newsreleases/2018/march/implantable-sensor-relays . . . , downloaded Dec. 29, 2019, 6 pages.

*CGM Sensor Insertion and Removal Instructions*, Eversense®, Senseonics, Inc. 2017, 45 pages.

Grough et al., *Function of an Implanted Tissue Glucose Sensor for More than One Year in Animals*, HHS Public Access, Sci Transl Med. Author manuscript; Aug. 7, 2015, 19 pages.

Wang, *Electrochemical Glucose Biosensors*, Chem. Rev. 2008, 108, ® 2008 American Chemical Society, 12 pages.

Bruen et al., *Glucose Sensing for Diabetes Monitoring: Recent Developments*, Sensors 2017, 17, 1866, www.mdpi.com/journal/sensors, 21 pages.

Harris et al., *Common Causes of Glucose Oxidase Instability in In Vivo Biosensing: A Brief Review*, Journal of Diabetes Science and Technology, vol. 7, Issue 4, Jul. 2013, 9 pages.

Farra et al., *First-in-Human Testing of a Wireless Controlled Drug Delivery Microchip*, www.sciencetranslationalmedicine.org, Feb. 22, 2012, vol. 4, Issue 122, 12 pages.

*Meet Eversense, the Implantable Continuous Glucose Monitor (CGM)*, https://www.diabetesdaily.com/blog/meet-eversense-the-implantable . . . , downloaded Sep. 14, 2018, 31 pages.

Wang, *Glucose Biosensors: 40 Years of Advances and Challenges*, Electroanalysis 2001, 13, No. 12, 6 pages.

International Search Report and Written Opinion in PCT/US2020/014692 mailed May 22, 2020, 17 pages.

\* cited by examiner

US 12,471,812 B2

SUBCUTANEOUS BIOSENSOR

CROSS-REFERENCE TO RELATED APPLICATIONS

This patent application claims the benefit of PCT Patent Application No. PCT/US2020/014692, filed on Jan. 23, 2020, and entitled "SUBCUTANEOUS BIOSENSOR," which claims the benefit of U.S. Provisional Patent Application Ser. No. 62/800,221, filed on Feb. 1, 2019, and entitled "SUBCUTANEOUS BIOSENSOR," the contents of both of which are hereby expressly incorporated by reference in their entireties.

TECHNICAL FIELD OF THE DISCLOSURE

This disclosure relates generally to the field of biosensing devices and, more particularly, to a multi-analyte molecular sensing system designed for long-term implantation in the body.

SUMMARY OF THE DISCLOSURE

One embodiment is a multi-analyte molecular sensing system designed for implantation in a body of a subject. The sensing system includes an implant comprising a flexible substrate having a plurality of electronics systems disposed thereon; a sensor array comprising multiple sensors disposed on the flexible substrate; a sensor protection mechanism for providing selective protection and exposure of one or more of the sensors; a power system for providing power to the electronics systems; a data communication system for communicating with one or more external devices; and a biocompatible housing for protecting the implant.

Another embodiment is a system comprising a flexible substrate having disposed thereon a plurality of electronics systems disposed thereon; a sensor array comprising multiple sensors; a sensor protection mechanism for providing selective protection and exposure of one or more of the sensors; and a communication system for transmitting signals to and receiving signals from at least one external device, wherein the flexible substrate is rolled into a cylindrical shape, the system further comprising a biocompatible housing disposed on an outside surface of the cylindrical shape.

Yet another embodiment is a method comprising using a syringe to implant a sensing system beneath a surface of a subject's skin, the sensing system comprising a flexible substrate having disposed thereon a sensor array comprising multiple sensors covered by a protective layer; selectively exposing at least one of the sensors by disrupting the protective layer thereof such that the exposed at least one of the sensors electrochemically senses an environment at the exposed at least one sensor; and communicating data representative of the sensed environment at the exposed at least one sensor to an external device.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS

Figure 1:
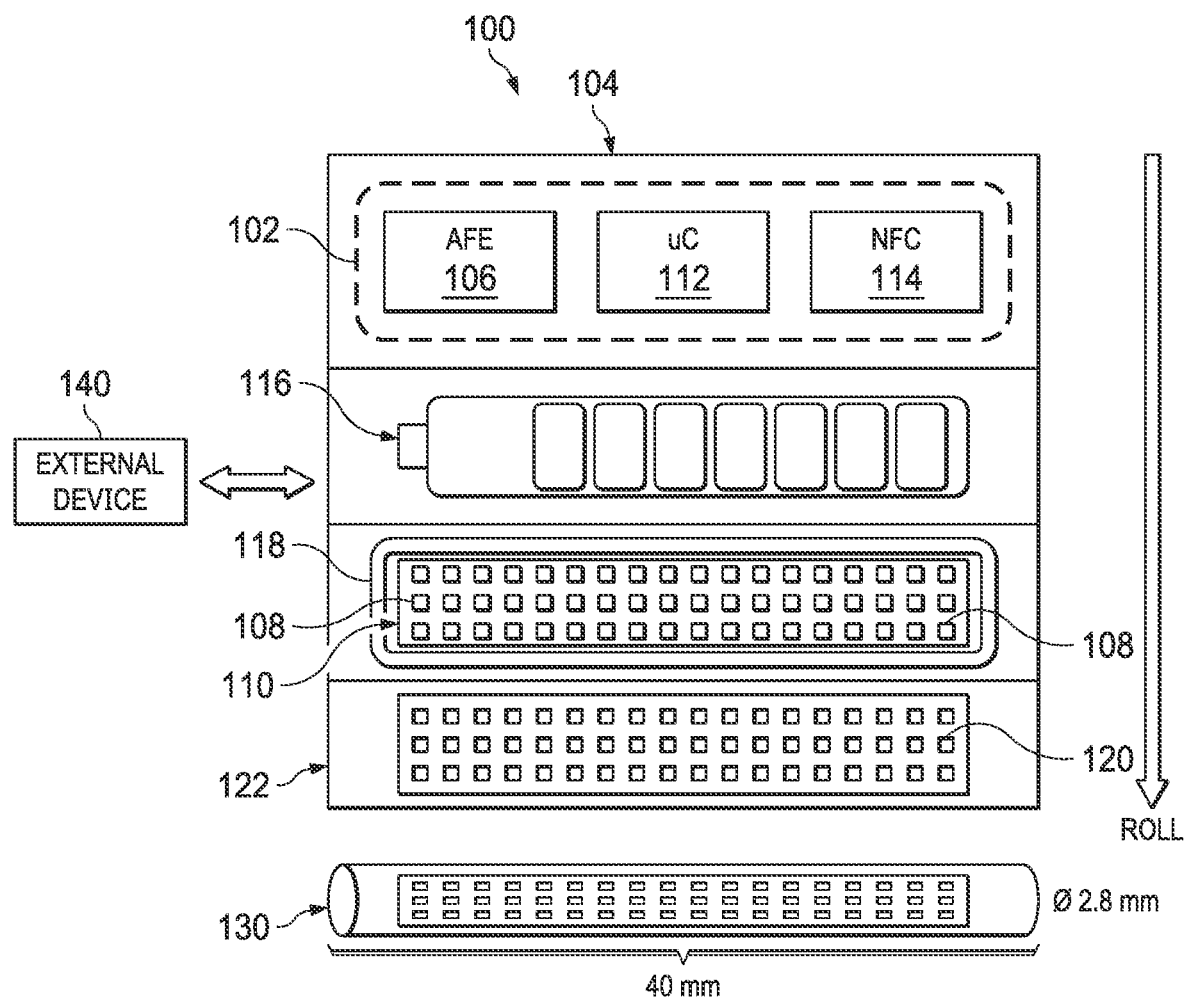
FIG. 1 is a schematic diagram of a multi-analyte molecular sensing system for long-term implantation into the body of a subject in accordance with embodiments described herein.

Embodiments described herein comprise a multi-analyte molecular sensing system designed for long-term implantation in the body. At the heart of the system is the implant itself, which includes electronics, sensors, a power system, a data communication system, and a biocompatible housing, and which may be configured as a long and narrow cylinder to enable its implantation underneath the skin in the subcutaneous space by a syringe. In certain embodiments, a length of the cylinder is less than or equal to 40 mm and a diameter of the cylinder is less than or equal to 2.8 mm. FIG. 1 illustrates an example of such an implant in accordance with features of embodiments described herein.

Features of the embodiments of the system described herein include, but are not limited to, mechanical assembly of the device onto a flexible substrate, which can be rolled or folded into the final device form-factor; incorporation of an flexible battery (e.g., as described in U.S. patent Publication Ser. No. 15/726,329) to enable easy assembly by rolling the implant; incorporation of integrated passives, such as integrated capacitors (e.g., iPassives available from Analog Devices, Inc., of Norwood, Mass., and silicon capacitor arrays from Murata Integrated Passive Solutions, of Caen, France), for space-efficient decoupling; arrangement of non-flexible planar electronic chips in the center of the roll for protection by the outer layers; mechanical thinning of the chips to enable rolling into smaller diameter; a sensor array comprising an arrangement of biological sensors on the outer layer of the roll for exposure to analyte fluids; and incorporation of an array of chemical sensing sites (or "sensors") with a protection layer and controlled exposure mechanism, thereby enabling one sensor to be used at a time while the others remain inert until needed. In certain embodiments described in greater detail herein, a mechanism is provided for selectively opening and subsequently closing individual sensors via control inputs from an external device.

Additional features include use of multiple transduction technologies, including 0D, 1D and 2D materials and/or devices (such as zinc oxide transistors, gold, platinum, or palladium nanowires, nanotubes, or nanoparticles, silicon or semiconductor nanowires, nanotubes, or nanoparticles, or carbon nanotubes); orientation and anchoring mechanisms to secure the implant in the interstitial space; and the inclusion of a specific panel of biochemical tests, determined a priori and loaded into wells comprising the sensor sites on a patient-by-patient basis.

Referring to FIG. 1, an implant 100 for implementing a multi-analyte molecular sensing system for long-term implantation into the body of a subject will now be described in detail. As shown in FIG. 1, the implant 100 includes a number of electrical components 102, which may be integrated into the implant or configured as separate chips, disposed, or assembled, on a biocompatible flexible substrate 104, such as one of a number of biocompatible flexible substrates available from Dyconex AG of Bassersdorf, Switzerland. In certain embodiments, the substrate 104 combines biocompatible structures and conventional printed circuit board (PCB) technology and may be composed of dielectric base materials, such as liquid crystal polymer (LCP), polyimide (PI), parylene, polyether ether ketone (PEEK), transparent conductive polyester, screen-printed polyester, or glass. Non-biocompatible materials may be protected by a biocompatible film. Metal films may be electroplated on the substrate or laminated to provide connections.

Flexible electronics, or "flex circuits," is a technology for assembling electronic circuits by mounting electronic devices on flexible plastic substrates, such as those described above. Additionally, flex circuits may include screen printed silver circuits on polyester. They may be manufactured using identical components used for rigid PCBs, allowing the board to conform to a desired shape, or flex, during use. Alternatively, various etching techniques may be used to thin down the traditional silicon substrate to a few tens of micrometers, for example, to gain reasonable flexibility (e.g., a 5 mm bending radius).

The electrical components 102 may include an analog front end ("AFE") system 106 for performing analog measurements from a transduction mechanism and which may also actuate the exposure of one or more sensor elements 108 comprising a sensor array 110; a microcontroller ("µC") 112 for performing control functions, such as determining when to take measurements and when to expose a new sensor, and coordinating communications and power functions; and a near field communications ("NFC") module 114, which receives power from outside the body of the subject in which the implant 100 is disposed and which performs rectification and power management in conjunction with a local storage element, such as a flexible battery 116, and bidirectional wireless communication.

Electrical components 102 may further include an optical power and communication module ("OPC") for enabling power and data to be transferred optically (possible due to proximity of implant to the surface of the skin) at a preferred wavelength in the near infrared ("NIR") range to enable better penetration through tissue; a wireless transceiver ("TRx") which may be implemented as a far-field wireless transceiver, such as a 900 MHz or 2.4 GHz low power transceiver, for providing low data rate communications over longer range than the NFC system (comprising the NFC module 114 and an NFC antenna 118), thereby enabling additional use cases for extended operation without continuous proximity to a body-worn device; a flexible battery comprising an energy reservoir to supply energy to the system between wireless charging from an external device to avoid the necessity of charging the system on a continuous basis and in a manner in which, due to the mechanical flexibility thereof, would facilitate the manufacturing and assembly of the implant; and a capacitor, such as a conventional ceramic capacitor or a super-capacitor, for supplying high frequency power demands, such as brief pulses of current necessary for far-field wireless transmissions or for actuating the sensor exposure mechanism, which is preferably integrated on or with the silicon of the implant in order to conserve volume.

In one embodiment, the sensor array 110 comprises an arrangement of biological, electrochemical, and/or biochemical sensors (e.g., sensors 108) for exposure to analyte fluids. In certain embodiments, the sensors may be gold-based sensors. A sensor protection layer along with a controlled exposure mechanism 120 is provided for enabling exposure of one sensor at a time, while the other sensors remain inert until needed and exposed. In certain embodiments described in greater detail herein, the exposure mechanism 120 selectively opens (and may subsequently close) individual sensors via control inputs from an external device.

As previously noted, in certain embodiments, the implant 100 includes a biocompatible housing 122 and is designed to be rolled into a long, narrow cylinder 130 to enable its implantation underneath the skin in the subcutaneous space by a syringe. In certain embodiments, a length of the cylinder is less than or equal to 40 mm and a diameter of the cylinder is less than or equal to 2.8 mm. In other embodiments, the implant 100 may be folded in some manner for easy implantation. As shown in FIG. 1, the elements of the implant 100 are arranged on the flexible substrate 104 such that, when rolled from a first end 132 to a second end 134, the electronics 102 and battery 116 are contained within the roll 130, while the sensor array 110 is disposed on an outer surface of the roll such that individual sensors 108 may be selectively exposed to analyte fluids within the body of the subject via the protection layer and controlled exposure mechanism.

In accordance with features of embodiments described herein, the implant 100 may include a variety of functionalization, transduction mechanisms, and detection schemes to create biochemical sensors for target analytes. The detection scheme(s) may be indirect, including, for example, interaction of target analyte with functionalization, which leads to signal transduction and finally read out, or direct, including, for example, direct optical detection of analyte molecule.

As noted above, one or more protection mechanisms may be implemented in connection with the implant. For example, one such protection mechanism may include selective protection and exposure of individual sensors. In particular, for indirect detection via a chemical system, a sensor array of an implant may include multiple (e.g., on the order of 1000s or more) individual sensors, each protected by a protection mechanism that may be selectively removed by the electronic system in order to activate the sensing site at a pre-determined time. In certain embodiments, the sensors may be gold-based sensors. In some embodiments, the protection mechanism may be opened and subsequently closed. Protection mechanisms may include, for example, a chip including two piezoelectric layers (e.g., zinc oxide) overlapping each other; a chip with a flexible or rigid membrane controlled via electrostatic or electromagnetic forces (e.g., coil or capacitor electrodes embedded in the membrane); a chip with biodegradable membranes, with each sensing site being protected by a membrane of a different thicknesses, whereby the variation in thickness results in the respective membranes degrading at different rates, thereby enabling time controlled exposure of sensor sites; and a chip with a membrane coated with a hydrogel material, wherein actuation is controlled by stresses applied on the membrane by hydrogel deformation (e.g., expansion/shrinkage). It will be noted that, when not powered, the preferred design of a protection mechanism is normally-closed.

In certain embodiments, removal or opening of a protection mechanism may be triggered on a regular schedule, for example, weekly or monthly, to provide continuous sensing for a target analyte molecule. Alternatively, removal or opening of a protection mechanism may be performed irregularly in response to an external command to provide sensing for a target analyte only when needed. For example, a correctly functionalized sensor site may be activated to measure the status of a particular bacterial infection on a short-term basis during an illness of a subject. Such a design would facilitate conservation of sensor sites by requiring fewer copies of sensors that are rarely used.

Functionalization will now be described in greater detail. For indirect detection, specificity of a sensor is determined by its functionalization. A transducer may be functionalized by aptamers, antibodies and antigen pairs, nucleic acids, enzymes, and/or proteins. The functionalization may be common across all of the sensing sites or it may be selected to cover a panel of biomolecules to be sensed. A selected panel of molecules may be common to all manufactured devices or may be tailored to individual patients based on feedback from a physician or other specialist.

Transduction mechanisms will now be described in greater detail. A sensor will be in contact with a bodily fluid, which may include but is not limited to interstitial fluid and/or blood. Placement of an implant in other areas of the body, such as bladder, stomach, or intestine, would bring the sensor in contact with other bodily fluids, such as urine, gastric fluid, or intestinal fluid, for example. As a result, the chemical biosensor must be biocompatible and sensitive enough to detect the desired analytes. Sensor sensitivity is related to the type of transducers deployed, which may include but are not limited to field-effect transistors ("FETs") composed of zinc oxide or other semiconductor, metal (e.g., gold or platinum) nanowires, nanotubes, or nanoparticles, and semiconductor (e.g., zinc oxide or silicon) nanowires, nanotubes, or nanoparticles. The transduction mechanism may also be implemented as an optical system using a fluorophore or quantum-dot system, which would then be read out using photometry, such as with an optical sensor or sensor array or with a spectrometer. The transduction mechanism may also be implemented using direct optical detection of the analyte molecule by photometry or spectroscopy. Depending on the transduction mechanism deployed, the signal generated by the transducer may be read electrically (voltage, impedance, current) or optically using photometry or spectroscopy.

In certain embodiments, other sensors may be deployed to measure additional metrics to provide additional biometric information useful for interpreting conditions not possible with only one sensor or metric. Such other sensors may also be necessary for proper operation of the chemical analyte sensor and may include one or more of a temperature sensor, a motion sensor, a blood pressure sensor, a pH sensor, and a microneedle with controlled extension.

A temperature sensing scheme may be used to measure the temperature of the device or the core temperature of the body in which the implant system is deployed and may include two temperature sensors disposed on opposite sides of the implant to improve core body temperature estimation accuracy due to the gradient between the inside and outside of the body. A motion sensor for detecting motion of a subject may be implemented as an accelerometer and/or gyroscope. Detection of motion is an indicator of activity by the subject and also orientation of the body or limb in which the sensor is implanted. A blood pressure sensor for detecting the blood pressure of the subject may be implemented as an accelerometer or a strain/stress sensor. In certain embodiments, it may be advantageous to place the implant close to a solid backing, such as a bone, to assist with more accurate pressure measurement. A microneedle with controlled extension may provide an alternative fluidic interface to tissue potentially outside the main fibrous capsule that envelopes the system. The microneedle may be actuated by the implantation, by contact with fluid, or by control from an external device.

The orientation of the implant system in the body may be important depending on the type of sensor and communication method used. To position the implant in a preferred orientation, during insertion, the intensity of the communication signal (such as an NFC or RF signal) as detected by an external communication device may be used to determine orientation of the antenna associated with the implant. In particular, a stronger signal detected by the external communication device would indicate that the implant antenna is facing outward from the body, while a weaker signal would indicate that the implant is facing inward to the body. The implant can be adjusted to the optimum position and orientation before final insertion/implantation.

Figure 2A:
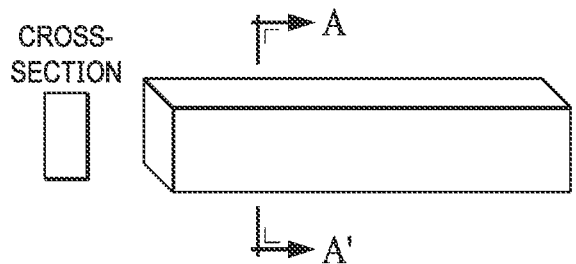
FIGS. 2A and 2B each illustrate a side view of multi-analyte molecular sensing system, such as the multi-analyte molecular sensing system of FIG. 1, configured in accordance with passive methods of anchoring an implant comprising the system in the body of the subject.
Figure 2B:
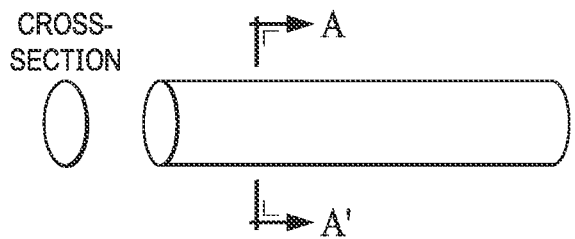
Figure 3:
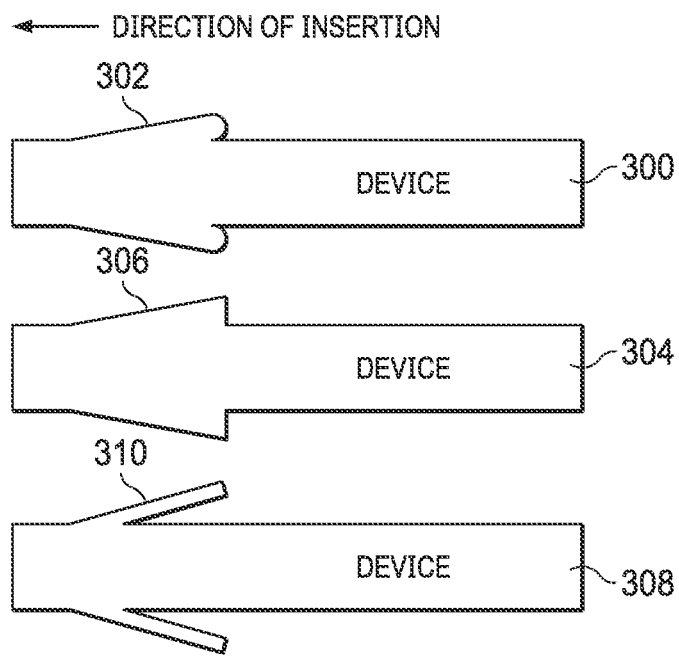
FIG. 3 illustrates side views of a plurality of multi-analyte molecular sensing systems, such as the multi-analyte molecular sensing system of FIG. 1, each configured in accordance with passive methods of anchoring an implant comprising the system in the body of the subject.

To prevent the implant system from moving or changing orientation, the system may be anchored to the surrounding tissue. Passive methods of anchoring the implant involve engineering the shape of the implant. For example, as shown in FIGS. 2A and 2B, to prevent rotation of the device, its cross-section may be designed to be sufficiently non-radially symmetric, such as rectangular (FIG. 2A) or oval-shaped (FIG. 2B). Such an anchoring method would render the implant amenable to possible removal. As shown in FIG. 3, a variety of other passive anchoring method may include adding protrusions on the outer surface of the implant to maintain the position and orientation of the implant. For example, an implant 300 includes a fin 302, an implant 304 includes a collar 306, and an implant 308 includes fins 310. For example, in the case of a flap-shaped protrusion, the flaps (e.g., fins 310) could be designed to lie flush to the surface of the implant 300 prior to and during insertion and then extend outward from the implant surface once the implant is in place. Protrusions may be placed in a single or multiple locations along the surface of the implant.

Active anchoring method may include a protrusion or flap on the surface of the implant that lies flush to the surface until it is electrically or mechanically activated to anchor the device in the desired position. The protrusion may be subsequently electrically or mechanically retracted for removal of the implant. Extension and retraction of protrusions may be controllable by the user through use of a piezoelectric material. It will be recognized that, in certain embodiments, a combination of active and/or passive anchoring mechanisms may be used in connection with a single implant.

Removal the of the implant may not be necessary; however, if the implant is to be removed, a small incision in the skin may be made and the implant pulled out under a local anesthetic. A less invasive method may involve inserting a syringe or metal probe with a magnetic tip under the skin near the implant such that the implant is magnetically attracted to the syringe/probe to guide such that the implant is removed with syringe/probe.

Referring again to FIG. 1, in certain embodiments, the system comprising the implant 100 may interact with one more external devices and systems, represented in FIG. 1 by an external device 140, to provide telemetry and device control. In certain embodiments, the external device 140 may include a body-worn device, such as a patch, arm-band, or device mounted in the clothing, situated in close proximity to the implant 100 to enable efficient power and data transfer between the body-worn device and the implant system. In situations in which the body-worn device comprises a patch, the patch may be continuously worn or may be worn temporarily only during periods when the implant requires charging or high-bandwidth data communication. The body-worn device may communicate via a short-range wireless link with gateway devices, such as a smartphone, and may also be equipped with physiological sensors, such as motion sensors and sweat sensors. The body-worn device may also contain optical transceivers for photometry of an area just underneath the sensor site. The body-worn device may also include a capacitive touch sensor chip to ensure that the device is in proximity to the body and may turn off automatically if it determines it is not near the body in order to save power. In certain embodiments, the electronics 102 include appropriate mechanisms for communicating with the external device 140, including receiving data, power, and control signals from the device and providing data and other signals to the device.

In addition and/or as an alternative to a body-worn device, the external device 140 may include a body-proximate device, for example a gateway device such as a smartphone. A body-proximate device may telemetry data and issue commands to and from the body-worn device or may itself be capable of low-rate communication directly with the implant via traditional far-field wireless communication technologies, e.g., via one of the industrial, scientific and medical ("ISM") bands (for example, 900 MHz or 2.4 GHz). The gateway device may provide a connection to a server or cloud service, which may provide a repository for measured data and algorithms for interpreting and responding to the data.

Figure 4:
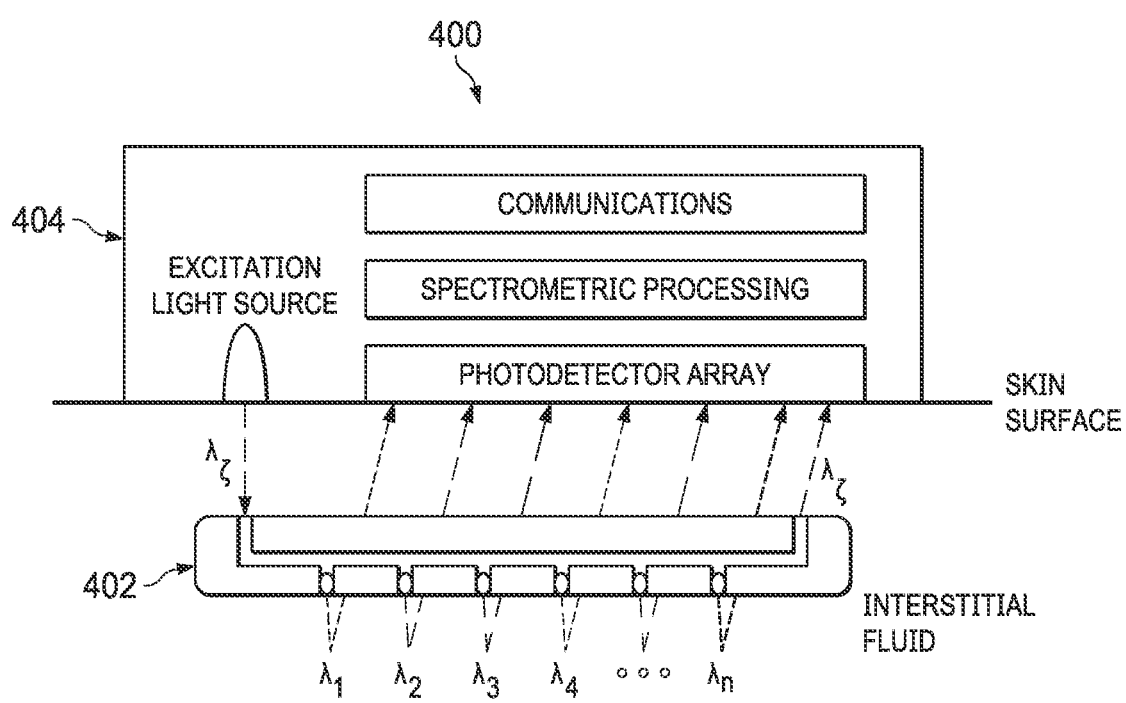
FIG. 4 is a schematic representation of a multi-analyte molecular sensing system for long-term implantation into the body of a subject, such as the multi-analyte molecular sensing system of FIG. 1, configured in accordance with alternative system partitioning.

FIG. 4 is a schematic representation of a multi-analyte molecular sensing system 400 for long-term implantation into the body of a subject configured in accordance with alternative system partitioning. In the embodiments shown in FIG. 4, an implant comprising the system 400 may include a light diffraction element 402, which may be enclosed in a biocompatible housing and injected into the body, e.g., using a syringe. The light diffraction element 402 may contain waveguides that carry the excitation source light to a series of quantum dots that emit light at targeted wavelengths. The light from the light diffraction element 402 is reflected by bodily fluid (e.g., interstitial fluid) and collected at a photodetector array 404 for analysis.

Embodiments described herein comprise a multi-analyte molecular sensing system designed for long-term implantation in the body. At the heart of the system is the implant itself, which includes electronics, sensors, a power system, a data communication system, and a biocompatible housing, and which may be configured as a long and narrow cylinder to enable its implantation underneath the skin in the subcutaneous space by a syringe.

A particular embodiment in which the sensors of the sensor array comprise glucose sensors or glucose sensing devices for extended use in vivo continuous glucose monitoring will now be described in greater detail. The embodiments described hereinbelow are for purposes of example only and should not be read as limiting the sensors/sensor array described herein above (e.g., sensors 108 and sensor array 110) to glucose sensing only.

Figure 5:
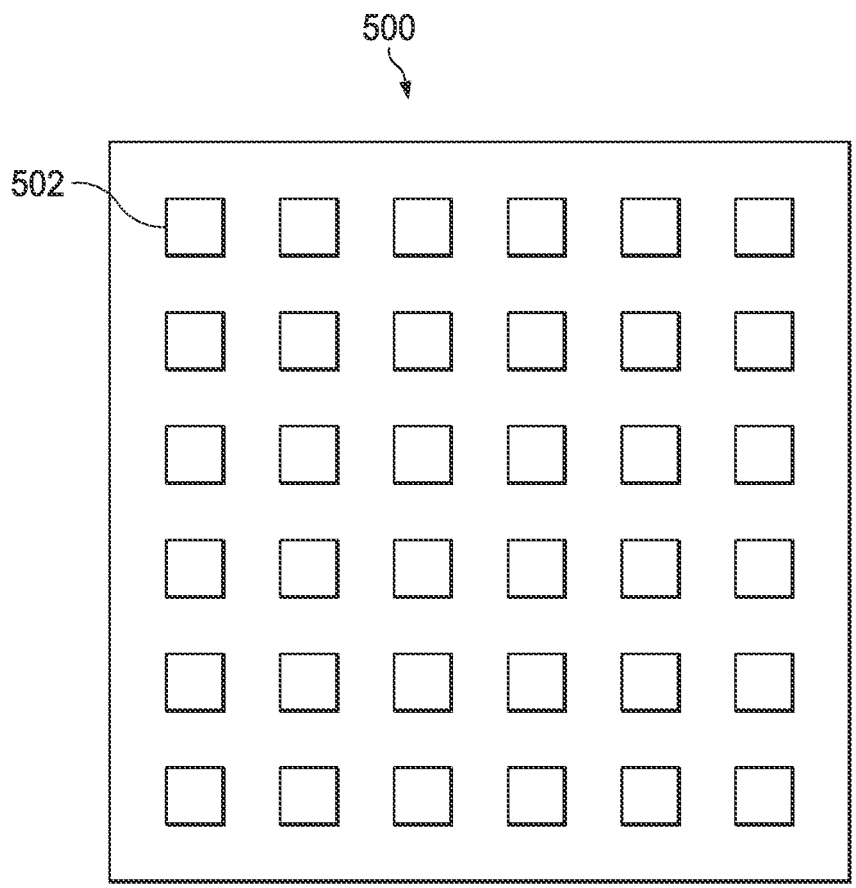
FIG. 5 is a top schematic view of an example sensor for use in the multi-analyte molecular sensing system for long-term implantation into the body of a subject in accordance with some embodiments of the disclosure.
Figure 6A:
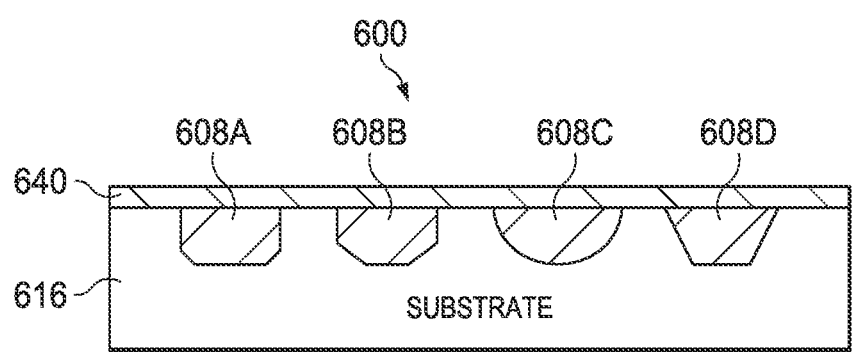
FIGS. 6A-D and 7 are illustrative side views of the example sensor of FIG. 5 in accordance with some embodiments of the disclosure.
Figure 6B:
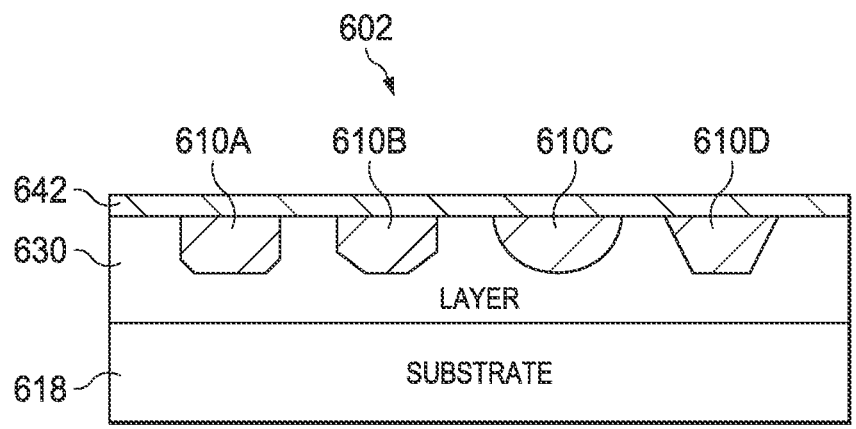
Figure 6C:
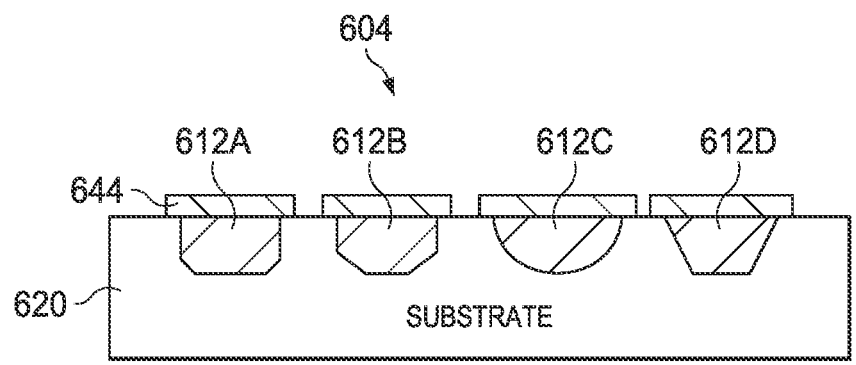
Figure 6D:
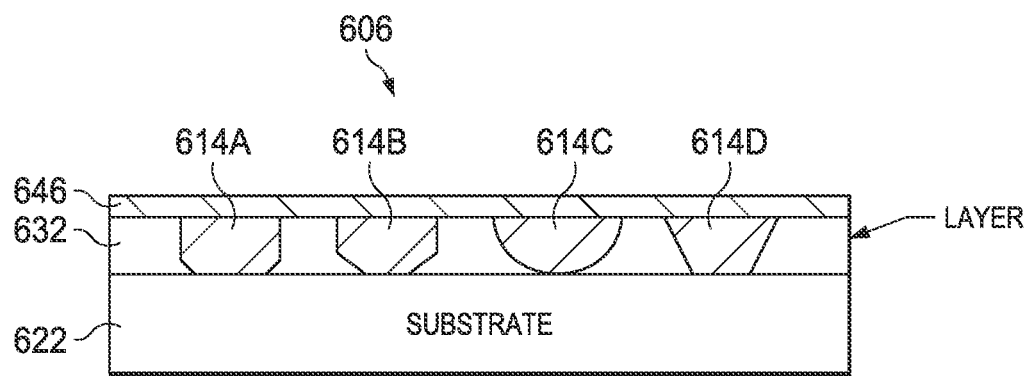
Figure 7:
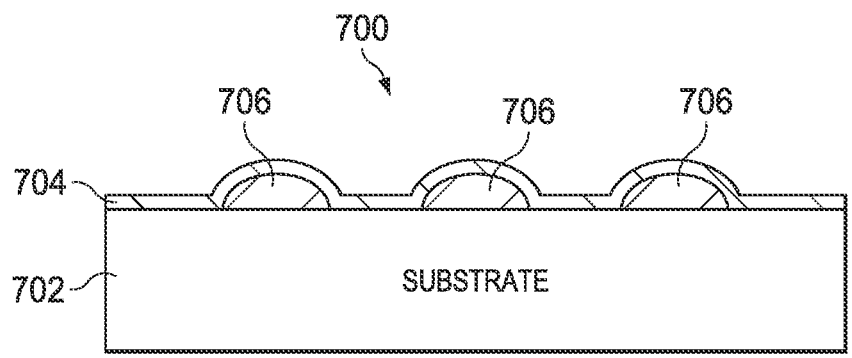

The longevity of continuous glucose sensing devices has been limited to a few weeks due in large part to the transient nature of the chemical enzyme glucose oxidase. Upon exposure to physiological fluids, the enzyme slowly degrades from various processes and eventually loses its sensitivity to glucose. To provide long-term, continuous glucose sensing, e.g., to implement a glucose sensing implant, multiple glucose oxidase sensing sites can be protected by a protection layer, and their exposure can be triggered one-at-a-time. The proposed glucose sensor can include multiple protected sensing sites that would undergo triggered exposures to activate them for sensing, one-at-a-time. FIG. 5 is a top view of a glucose sensor array 500, according to some embodiments of the disclosure. The glucose sensor array 500 has a plurality of sensing sites, or sensors, such as sensing sites 502. In the illustrated embodiment, the array 500 is a grid of 6×6 sensing sites 502. Sensing sites are individual sensors that are controllable to electro-chemically sense the environment at the sensing site and generate suitable signals representative of a characteristic of the sensed environment.

Assuming a triggered and/or calibrated sensing site could perform sensing for a few weeks as in state-of-the-art glucose sensors, and assuming a device could contain hundreds or thousands of sensing sites that could be triggered one-at-a-time, a glucose sensor can be capable of years-long glucose sensing by triggering the exposure of a new one of the sites every few weeks or as otherwise needed.

A technical task is to provide continuous glucose sensing in vivo for an extended period of time. One solution is a glucose sensing device for implantation under the skin. The glucose sensing device includes a plurality of glucose sensing sites that can be exposed to bodily fluids at certain timed intervals to measure glucose levels. A glucose sensor can have a protection layer to seal the sensing sites until they are ready to be exposed. The sensing sites can be addressable individually or in sets to initiate the opening of the protection layer.

While the examples are focused on glucose sensing, as previously noted, it is envisioned by the disclosure that the techniques can be extended to other types of sensing as well.

The following passages describe various techniques for site protection and site exposure. In some embodiments, additional components can be included to construct a wireless system that can be used as a self-sufficient product, i.e., glucose sensing implant, derived from the proposed sensor.

One technique of storing or protecting sensing sites until their timed exposure is in wells etched or formed in a substrate. The sensing sites can be formed in the sensor wells. Referring back to FIG. 5, the exemplary glucose sensor array 500 has grid of sensor wells comprising individual sensors 502. FIGS. 6A-6D and 7 each illustrate a side view of an exemplary glucose sensor 600, 602, 604, 606, and 700, respectively, according to some embodiments of the disclosure. A variety of wells 608A-608D, 610A-610D, 612A-612D, 614A-614D, are formed in the glucose sensors 600, 602, 604, 606. A substrate 616-622, 702, of each of the sensors 600-606 and 700 may be made of silicon or other biocompatible material. The wells may be etched into the substrate (e.g., FIGS. 6A and 6C) or in a layer 630, 632, on top of the substrate (e.g., FIGS. 6B and 6D). The sensing sites can be sealed inside the wells by a protection layer 640, 642, 644, 646, 704. The protection layer may include a continuous film (e.g., FIGS. 6A, 6B, and 6D) or individual membranes for each well (e.g., FIG. 6C). The number of sensing sites or wells can be ten to hundreds to thousands. The sensing sites can be arranged in the glucose sensor according on a suitable pattern (e.g., honeycomb pattern, grid, circular pattern, etc.). Another implementation is a capsule configuration where the sensing sites reside inside capsules 708 anchored to a substrate (e.g., FIG. 7). Wells are optional in such an implementation. The protection layer can include a continuous film having a plurality of capsules (e.g., FIG. 7) or in individual membranes for each capsule.

It will be noted that if a sensing site is sealed within a well, as in certain embodiments described above, then a new sensing site must be opened in order to obtain a new reading, as biofluid used to make a reading will be trapped within the well, resulting in a same or similar reading over time if the same sensing site is used.

The material that protects the sensing sites until exposure is biocompatible because this surface of the protection layer faces the bodily fluid. The choice of material can depend on the physical configuration of the protection layer and the opening mechanism. The protection layer can also be composed of more than one material. Options of materials include polymers such as parylene and metals such as gold.

There are several possible mechanisms to expose the sensing sites to the bodily fluid. The protection layer is a membrane (or multiple membranes) sealing the sensing sites inside a chamber. This membrane can be induced or triggered to open by one or more mechanisms.

In some embodiments, the protection layer can be broken with acoustic actuation to trigger the sensor site exposure. The protection layer can include a film thin enough that would break from exposure to acoustic stress. The acoustic conduction to the film can be induced using a piezoelectric material attached to the film or surrounding part or all of the well. The acoustic frequencies can include ultrasonic frequencies.

In some embodiments, the protection layer can include a film fabricated to be broken with a small deflection to trigger the sensor site exposure. With sufficient stress, the film (or a portion of the film) can be broken with a small deflection. The deflection can be induced mechanically such as by an electrostatically-actuated micro-cantilever, acoustically, or by pressure change.

In some embodiments, the protection layer can be broken through thermal-induced expansion of the surrounding area of the well to trigger the sensor site exposure. The surrounding area of the well can be heated and can expand with temperature. The protection layer over the well is not heated and does not expand. The film layer will break because of the mismatch between the film and the perimeter of the well.

In some embodiments, the protection layer can be broken through thermal-induced expansion of the film to trigger the sensor site exposure. The protection layer can include a film that is heated and expands with temperature. The expansion of the film is not matched with the perimeter of the well that is not heated. The mismatch can tear the film.

In some embodiments, the protection layer can be broken based on a difference in coefficients of thermal expansion to trigger the sensor site exposure. The protection layer can include bilayer or multi-layer film composed of materials of different coefficients of thermal expansion (CTE). When the film is heated, the mismatch in CTE of the different layers/materials can cause the protection layer to break. The layers can all be continuous layers across the well. In some cases, one or more layers can be a line or shape (or other suitable shapes), while at least one layer is continuous across the well to maintain a seal.

In some embodiments, the protection layer can be broken based on a pH change to trigger the sensor site exposure. There is a class of polymers that are sensitive to pH. A change in pH can cause the polymer to change dimensions. For this application, there are a few possibilities. In some cases, the polymer can form the cover over the wells. By inducing a local pH change (either externally or due to physiological changes), the polymer can shrink and thus allow the glucose oxidase (or appropriate enzyme) to interact with bodily fluids. In some cases, the polymer can sit on top of a thin cover/membrane over the wells. By inducing a local pH change, the polymer would swell (or shrink), thus imparting mechanical stress on the membrane and rupture it, allowing the glucose oxidase to interact with bodily fluids.

In some embodiments, the protection layer can be broken based on electrowetting to trigger the sensor site exposure. A hydrophobic or hydrophilic coating can protect a film of the protection layer. This coating's hydrophobicity can be changed electrically by applying a voltage. Applying a voltage causes the coating to become hydrophilic and the layer can be dissolved when it comes into contact with water or other fluid.

In some embodiments, the protection layer can be broken based on electrochemical exposure to trigger the sensor site exposure. The protective layer can include a material that can be removed by an electrochemical process. An example material is a gold membrane, which can be electrochemically etched at +1.04V vs. a saturated calomel electrode (SCE) reference.

In some embodiments, the protection layer can be broken based on thermal exposure to trigger the sensor site exposure. The protective layer can include a material that is removed thermally, for example by ablation at high temperatures.

In some embodiments, the protection layer can be broken based on gas pressure to trigger the sensor site exposure. The protection layer can be removed by the build-up of gas pressure via a triggered chemical or physical mechanism. For example, triggering the production of gas within a sealed well would lead to failure of the seal and hence exposure of the well to the external environment.

Figure 8:
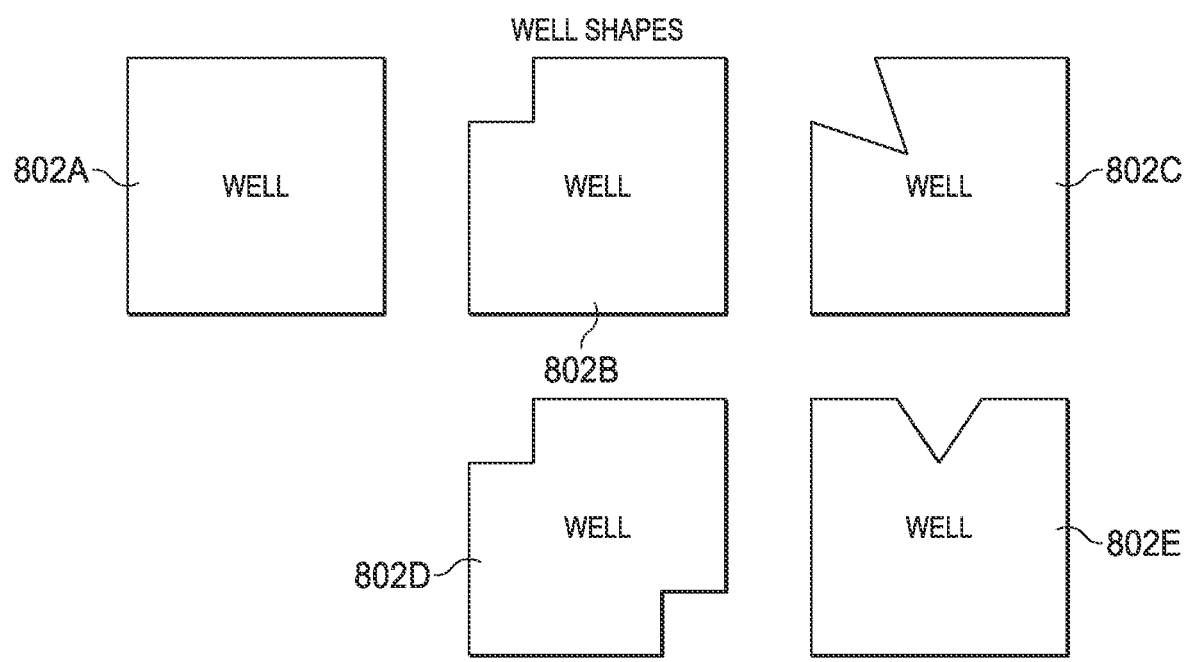
FIG. 8 depicts exemplary well shapes of an example sensor for use in the multi-analyte molecular sensing system for long-term implantation into the body of a subject in accordance with some embodiments of the disclosure.

In some embodiments, the protection layer can be broken through appropriate designs of the shape well opening to trigger the sensor site exposure. The shape of the well opening can be fabricated with corners that provide high-stress points for the protection layer film. These corners can initiate the opening of the film. FIG. 8 depicts exemplary well shapes, according to some embodiments of the disclosure. Well 802A is square. Wells 802B-802E have corners which can serve as high-stress points for the protection layer film. The corners can facilitate mechanical breakage or opening of the film.

The protection layer can be laminated onto the substrate. Polymers are suitable materials for lamination. In some embodiments, the protection layer can include multiple layers such that one is a laminated layer and another layer is deposited on top of the laminated layer.

Figure 9:
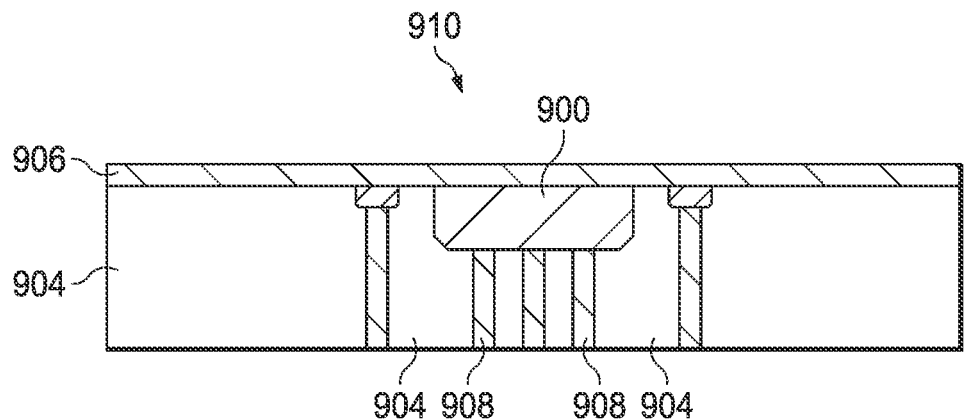
FIGS. 9-11 show exemplary sensor structures resulting from different fabrication methods of an example sensor for use in the multi-analyte molecular sensing system for long-term implantation into the body of a subject in accordance with some embodiments of the disclosure.
Figure 10:
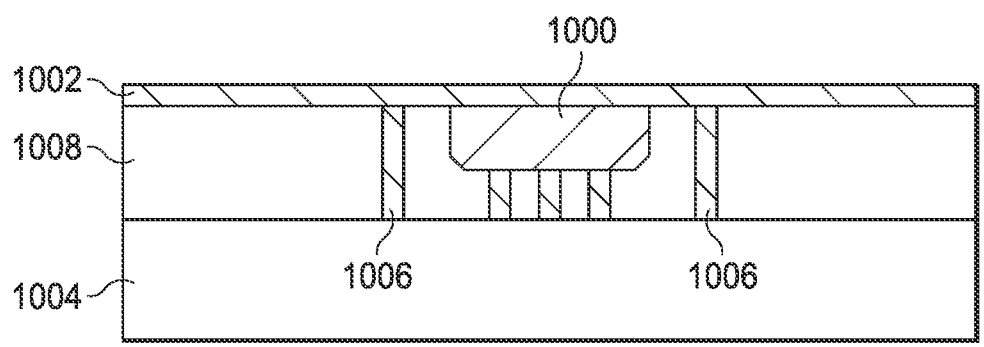
Figure 11:
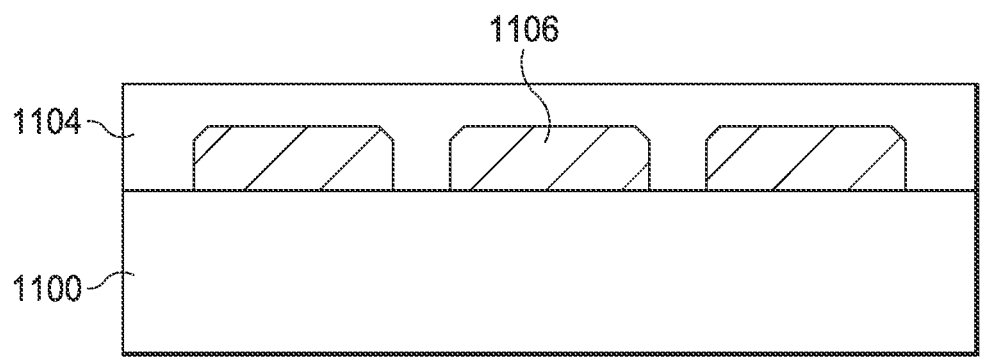

FIGS. 9-11 show side views of exemplary glucose sensors illustrating fabrication methods, according to some embodiments of the disclosure.

Sensor electronics may be fabricated on a top surface of a silicon wafer serving as a substrate. In cases in which wells are fabricated on the same substrate, the electronics can sit beside the wells. Referring to FIG. 9, when sensor wells 900 are formed in a substrate 902, sensing sites 904 inside the wells 900 and under a protection layer 906 may be connected electrically by through-silicon vias (TSVs) 908 to the backside of the wafer 910. Using TSVs 908 can separate the electronics from the sensing sites (no longer sitting beside the wells), so the side facing the fluid has the sensing sites and the side facing away from the fluids can include the electronics.

As shown in FIG. 10, when sensor wells 1000 are formed in a layer 1002 above a substrate 1004, metal vertical interconnect access (vias) 1006 can be used to connect the sensing sites and protection layer to electronics on the surface of the substrate.

As shown in FIG. 11, another fabrication method includes building electronics on a silicon substrate 1100, and then functionalizing electrodes that are also on the silicon substrate. A protection layer 1104 with recessed cavities 1106 may be laminated on top.

Figure 12:
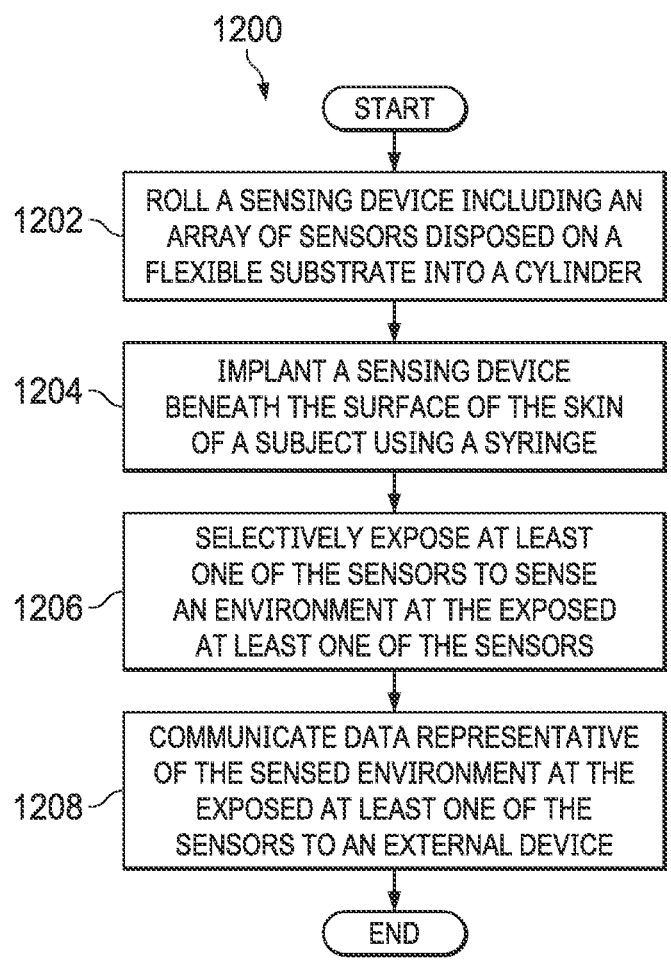
FIG. 12 is a flowchart illustrating a method of use of a multi-analyte molecular sensing system for long-term implantation into the body of a subject in accordance with one embodiment.

FIG. 12 is a flowchart illustrating a method 1200 for using of a multi-analyte molecular sensing system for long-term implantation into the body of a subject in accordance with one embodiment. Referring to FIG. 12, in step 1202, the sensing system is rolled into a cylinder. In step 1204, a syringe is used to implant the rolled sensing system beneath the surface of the skin of a subject. In step 1206, at least one of the sensors of the sensing system is exposed using one of them methods described hereinabove, for example. The exposed sensor(s) electrochemically sense an environment thereof. In step 1208, data representative of the sensed environment at the exposed sensor(s) is communicated to an external device to be analyzed and/or recorded, for example.

The full system can include one or more subsystems to enable continuous wireless operation. The system design also takes certain considerations into account.

The system can include a front end sensor. The front end sensor can include chemistry that can recognizes glucose molecules. For example, this could be based on glucose oxidase. The system would include many front end sensors serving as the sensing sites.

The system can include a transduction mechanism. The transduction mechanism can translate the front-end sensor signal into an electrical signal that can be detected by an electronic circuit.

The system can include an actuation mechanism. The actuation mechanism can selectively expose sensing sites upon receipt of a trigger.

The system can include a heater and a temperature sensor. A heater and a temperature sensor can optionally help control the local temperature to provide a better calibration for the glucose oxidase sensor front-end.

The system can include a processor (e.g., microprocessor, dedicated digital hardware, electronics, etc.). The processor can serve as a central processor for coordinating the functions of the glucose sensor system.

The system can include a wireless transceiver for power and data communications. Given the longevity of the implant, it may be beneficial to include a mechanism to receive power supplied from outside the subject having the implant. Also, it may be beneficial to receive and/or transmit data to an external device. Both power and data communications can be accomplished with near-field radio-frequency identification (RFID) style wireless transmission.

The system can include an external component. An external transceiver can be included in the system to supply power, send commands, and receive data. The external component can provide the capability to communicate with an insulin pump in order to support a closed-loop insulin delivery system.

The form factor of the system, i.e., the implantable portion of the system, is preferably elongated to support injection as a less invasive mechanism for delivering the device underneath the skin. The implantable portion can be thin and planar. The implantable portion can be flexible.

Example 1 is a multi-analyte molecular sensing system designed for implantation in a body of a subject, the sensing system including an implant comprising a flexible substrate having a plurality of electronics systems disposed thereon; a sensor array comprising multiple sensors disposed on the flexible substrate; a sensor protection mechanism for providing selective protection and exposure of one or more of the sensors; a power system for providing power to the electronics systems; a data communication system for communicating with one or more external devices; and a biocompatible housing for protecting the implant.

In Example 2, the system of Example 1 may further include the flexible substrate being rolled or folded such that a shape of the implant within the biocompatible housing is a long and narrow cylinder.

In Example 3, the system of any of Examples 1-2 may further include the implant being implanted into the body of the subject via a syringe.

In Example 4, the system of any of Examples 1-3 may further include a length of the cylinder comprising the implant shape being less than or equal to 40 mm.

In Example 5, the system of any of Examples 1-4 may further include a diameter of the cylinder comprising the implant shape being less than or equal to 2.8 mm.

In Example 6, the system of any of Examples 1-5 may further include the power system comprising a flexible battery.

In Example 7, the system of any of Examples 1-3 may further include at least one of the electronics systems comprising a non-flexible planar electronic chip.

In Example 8, the system of any of Examples 1-7 may further include the non-flexible planar electronic chip being situated on the flexible substrate such that it is protected by outer layers when the flexible substrate is rolled or folded into the cylinder shape.

In Example 9, the system of any of Examples 1-8 may further include the sensor array being disposed on an outer surface when the flexible substrate is rolled or folded into the cylinder shape.

In Example 10, the system of any of Examples 1-9 may further include the electronics systems comprising at least one of an analog front-end system, a microcontroller, a near field communication module, an optical power and communications module, a wireless transceiver, and a capacitor.

In Example 11 the system of any of Examples 1-10 may further include the selective exposure of one or more of the sensors being either scheduled or triggered by an external command.

In Example 12, the system of any of Examples 1-11 may further include the sensor protection mechanism comprising a membrane disposed over one of the sensors, the membrane comprising one of a biodegradable membrane having a thickness and a decomposition rate corresponding to a time at which the one of the sensors is to be exposed and a membrane coated with a hydrogel layer, wherein exposure of the one of the sensors is controlled by stresses applied to the membrane by swelling of the hydrogel layer.

In Example 13 the system of any of Examples 1-12 may further include each of the sensors being functionalized for sensing at least one of a biomolecule of interest and a biological cell of interest.

In Example 14 the system of any of Examples 1-13 may further include a shape of the implant operating to anchor the implant to surrounding tissue of the body in which it is implanted.

In Example 15 the system of any of Examples 1-14 may further include at least one protrusion on a surface of the implant operating to anchor the implant to surrounding tissue of the body in which it is implanted.

In Example 16 the system of any of Examples 1-15 may further include the system communicating with the external device for enabling telemetry and control of the system.

In Example 17 the system of any of Examples 1-16 may further include the external device comprising at least one of a body-worn device, a body-proximate device, a server, and a cloud-based service.

Example 18 is system comprising a flexible substrate having disposed thereon a plurality of electronics systems disposed thereon; a sensor array comprising multiple sensors; a sensor protection mechanism for providing selective protection and exposure of one or more of the sensors; and a communication system for transmitting signals to and receiving signals from at least one external device; wherein the flexible substrate is rolled into a cylindrical shape, the system further comprising a biocompatible housing disposed on an outside surface of the cylindrical shape.

In Example 19, the system of Example 18 may further include a form factor of the cylindrical shape being such that the system may be implanted beneath a surface of a subject's skin using a medical syringe.

In Example 20, the system of any of Examples 18-19 may further include the flexible substrate being rolled or folded such that a shape of the implant within the biocompatible housing is a long and narrow cylinder.

In Example 21, the system of any of Examples 18-20 may further include a length of the cylinder comprising the implant shape being less than or equal to 40 mm.

In Example 22, the system of any of Examples 18-21 may further include a diameter of the cylinder comprising the implant shape being less than or equal to 2.8 mm.

In Example 23, the system of any of Examples 18-22 may further include a flexible battery.

In Example 24, the system of any of Examples 18-23 may further include at least one of the electronics systems comprising a non-flexible planar electronic chip.

In Example 25, the system of any of Examples 18-24 may further include the flexible planar electronic chip being situated on the flexible substrate such that it is protected by outer layers when the flexible substrate is rolled or folded into the cylinder.

In Example 26, the system of any of Examples 18-25 may further include the sensor array being disposed on an outer surface when the flexible substrate is rolled or folded into the cylinder shape.

In Example 27, the system of any of Examples 18-26 may further include the electronics systems comprising at least one of an analog front-end system, a microcontroller, a near field communication module, an optical power and communications module, a wireless transceiver, and a capacitor.

In Example 28, the system of any of Examples 18-27 may further include the selective exposure of one or more of the sensors being either scheduled or triggered by an external command.

In Example 29, the system of any of Examples 18-28 may further include each of the sensors being functionalized for sensing at least one of a biomolecule of interest and a biological cell of interest.

In Example 30, the system of any of Examples 18-29 may further include a shape of the implant operating to anchor the implant to surrounding tissue of the body in which it is implanted.

In Example 31, the system of any of Examples 18-30 may further include at least one protrusion on a surface of the implant operating to anchor the implant to surrounding tissue of the body in which it is implanted.

In Example 32, the system of any of Examples 18-31 may further include the system communicating with the external device for enabling telemetry and control of the system.

In Example 23, the system of any of Examples 18-32 may further include the external device comprising at least one of a body-worn device, a body-proximate device, a server, and a cloud-based service.

Example 34 is a method comprising using a syringe to implant a sensing system beneath a surface of a subject's skin, the sensing system comprising a flexible substrate having disposed thereon a sensor array comprising multiple sensors covered by a protective layer; selectively exposing at least one of the sensors by disrupting the protective layer thereof such that the exposed at least one of the sensors electrochemically senses an environment at the exposed at least one sensor; and communicating data representative of the sensed environment at the exposed at least one sensor to an external device.

In Example 35, the method of Example 34 may further include rolling the sensing system into a cylinder prior to using the syringe to implant the sensing system.

In Example 36, the method of any of Examples 34-35 may further include a length of the cylinder comprising the implant shape being less than or equal to 40 mm.

In Example 37, the method of any of Examples 34-36 may further include a diameter of the cylinder comprising the implant shape being less than or equal to 2.8 mm.

In Example 38, the method of any of Examples 34-37 may further include the sensor array being disposed on an outer surface of the cylinder.

In Example 39, the method of any of Examples 34-38 may further include the selectively exposing at least one of the sensors being either scheduled or triggered by an external command.

In Example 40, the method of any of Examples 34-39 may further include each of the sensors being functionalized for sensing at least one of a biomolecule of interest and a biological cell of interest.

In Example 41, the method of any of Examples 34-40 may further include providing at least one protrusion on a surface of the sensing system to anchor the implant to surrounding tissue of the body in which it is implanted.

In Example 42, the method of any of Examples 34-41 may further include the external device comprising at least one of a body-worn device, a body-proximate device, a server, and a cloud-based service.

In Example 43, the system of any of Examples 1-17 may further include a light diffraction element enclosed within the biocompatible housing, the light diffraction element comprising at least one waveguide for carrying light from an excitation source to at least one quantum dot emitting light at least one targeted wavelength.

In Example 44, the system of Example 43 may further include light from the light diffraction element being reflected by bodily fluid of the subject and collected at a photodetector array.

The present disclosure includes apparatuses which can include means to implement any one or more parts of the various techniques disclosed herein.

It is also imperative to note that all of the specifications, dimensions, and relationships outlined herein have only been offered for purposes of example and teaching only. Such information may be varied considerably without departing from the spirit of the present disclosure, or the scope of the appended claims (if any) and/or examples. The specifications apply only to one non-limiting example and, accordingly, they should be construed as such. In the foregoing description, example embodiments have been described with reference to particular component arrangements. Various modifications and changes may be made to such embodiments without departing from the scope of the appended claims (if any) and/or examples. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system may be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and may accommodate a large number of components, as well as more complicated/sophisticated arrangements and configurations. Accordingly, the examples provided should not limit the scope or inhibit the broad teachings of the electrical circuits as potentially applied to myriad other architectures.

It should also be noted that in this Specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The "means for" in these instances (above) may include (but is not limited to) using any suitable component discussed herein, along with any suitable software, circuitry, hub, computer code, logic, algorithms, hardware, controller, interface, link, bus, communication pathway, etc.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that topologies illustrated in and described with reference to the accompanying FIGURES (and their teachings) are readily scalable and may accommodate a large number of components, as well as more complicated/sophisticated arrangements and configurations. Accordingly, the examples provided should not limit the scope or inhibit the broad teachings of the illustrated topologies as potentially applied to myriad other architectures.

It is also important to note that the steps in the preceding flow diagrams illustrate only some of the possible signaling scenarios and patterns that may be executed by, or within, communication systems shown in the FIGURES. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the FIGURES in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges, embodiments described herein may be applicable to other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 142 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A multi-analyte molecular sensing system designed for implantation in a body of a subject, the sensing system comprising:
    an implant device comprising:
        a flexible substrate having a plurality of electronics systems disposed thereon, with at least one of the plurality of electronics systems comprising a non-flexible planar electronic chip;
        a sensor array comprising multiple sensors disposed on the flexible substrate;
        a sensor protection mechanism configured to provide controllable protection and exposure of one or more of the multiple sensors;
        a power system configured to provide power to the plurality of electronics systems;
        a wireless transceiver configured to communicate with one or more external devices; and
        a biocompatible housing;
        wherein the flexible substrate is rolled or folded into a cylindrical shape within the biocompatible housing, the cylindrical shape containing the plurality of electronics systems within the cylindrical shape, with outer layers of the cylindrical shape shielding the non-flexible planar electronic chip when the flexible substrate is rolled or folded into the cylindrical shape, and having the sensor array disposed on an outer surface of the cylindrical shape and spaced apart from an axis of the cylindrical shape.

2. The multi-analyte molecular sensing system of claim 1, wherein the cylindrical shape is an elongated cylinder and a length of the cylinder is less than or equal to 40 mm.

3. The multi-analyte molecular sensing system of claim 1, wherein the cylindrical shape is a long and narrow cylinder and a diameter of the cylinder is less than or equal to 2.8 mm.

4. The multi-analyte molecular sensing system of claim 1, wherein the power system comprises a flexible battery.

5. The multi-analyte molecular sensing system of claim 1, wherein the cylindrical shape is an elongated cylinder.

6. The multi-analyte molecular sensing system of claim 1, wherein the plurality of electronics systems comprises at least one of an analog front-end system, a microcontroller, a near field communication module, an optical power and communications module, or a capacitor.

7. The multi-analyte molecular sensing system of claim 1, wherein the controllable exposure of one or more of the multiple sensors is either scheduled or triggered by an external command.

8. The multi-analyte molecular sensing system of claim 1, wherein the sensor protection mechanism comprises a membrane disposed over one of the multiple sensors, the membrane comprising one of a biodegradable membrane having a thickness and a decomposition rate corresponding to a time at which the one of the multiple sensors is to be exposed or a second membrane coated with a hydrogel layer, wherein exposure of the one of the multiple sensors is controlled by stresses applied to the membrane by swelling of the hydrogel layer.

9. The multi-analyte molecular sensing system of claim 1, wherein a shape of the implant device operates to anchor the implant device to surrounding tissue of the body in which it is implanted.

10. The multi-analyte molecular sensing system of claim 1, wherein at least one protrusion on a surface of the implant device operates to anchor the implant device to surrounding tissue of the body in which it is implanted.

11. The multi-analyte molecular sensing system of claim 1, wherein the wireless transceiver communicates with a particular external device of the one or more external devices for enabling telemetry and control of the system, wherein the particular external device comprises at least one of a body-worn device, a body-proximate device, a server, or a cloud-based service.

12. The multi-analyte molecular sensing system of claim 1 further comprising a light diffraction element enclosed within the biocompatible housing, the light diffraction element comprising at least one waveguide for carrying light from an excitation source to at least one quantum dot emitting light in at least one targeted wavelength.

13. The multi-analyte molecular sensing system of claim 12, wherein light from the light diffraction element is configured to be reflected by bodily fluid and collected at a photodetector array.

14. The multi-analyte molecular sensing system of claim 1, wherein the sensor array comprises a glucose sensor array having a grid of sensor wells.

15. A system comprising:
    a flexible substrate having disposed thereon:
        a plurality of electronics systems comprising a non-flexible planar electronic chip;
        a sensor array comprising multiple sensors;
        a sensor protection mechanism configured to provide controllable protection and exposure of one or more of the multiple sensors; and
        a wireless transceiver configured to transmit signals to and receiving signals from at least one external device;
    wherein the flexible substrate is rolled or folded into a cylindrical shape containing the plurality of electronics systems within the cylindrical shape, with outer layers of the cylindrical shape shielding the non-flexible planar electronic chip when the flexible substrate is rolled or folded into the cylindrical shape, and having the sensor array disposed on an outer surface of the cylindrical shape and spaced apart from an axis of the cylindrical shape, the system further comprising a biocompatible housing disposed on the outer surface of the cylindrical shape.

16. The system of claim 15, wherein the cylindrical shape is an elongated cylinder.

17. A method comprising:
    using a syringe to implant a sensing system beneath a surface of skin of a subject, the sensing system comprising a flexible substrate having disposed thereon a plurality of electronics systems and a sensor array comprising multiple sensors covered by a protective layer, wherein the flexible substrate is rolled or folded such that a shape of the sensing system is a cylinder containing the plurality of electronics systems within the cylinder, with the plurality of electronics system comprising a non-flexible planar electronic chip and outer layers of the cylinder shielding the non-flexible planar electronic chip when the flexible substrate is rolled or folded into the cylinder, and having the sensor array disposed on an outer surface of the cylinder and spaced apart from an axis of the cylinder;

controllably exposing at least one sensor of the multiple sensors by disrupting the protective layer thereof such that the exposed at least one sensor of the multiple sensors electrochemically senses an environment at the exposed at least one sensor; and communicating data representative of the sensed environment at the exposed at least one sensor to an external device.

* * * * *